United States Patent [19]

Takemi

[11] Patent Number: 5,383,216
[45] Date of Patent: Jan. 17, 1995

[54] SEMICONDUCTOR LASER WITH LIGHT MODULATOR

[75] Inventor: Masayoshi Takemi, Itami, Japan

[73] Assignee: Mitsubishi Denki Kabushiki Kaisha, Tokyo, Japan

[21] Appl. No.: 150,883

[22] Filed: Nov. 12, 1993

[30] Foreign Application Priority Data

Dec. 28, 1992 [JP] Japan .................. 4-361110

[51] Int. Cl.6 .................................. H01S 3/19
[52] U.S. Cl. ........................... 372/50; 372/26; 372/43
[58] Field of Search ............... 372/7, 11, 12, 26, 28, 372/39, 43, 44, 48, 50, 109, 45

[56] References Cited

U.S. PATENT DOCUMENTS

| | | | |
|---|---|---|---|
| 4,318,059 | 3/1982 | Lang et al. | 372/50 X |
| 4,563,765 | 1/1986 | Tsang et al. | 372/50 |
| 4,622,671 | 11/1986 | Tsang | 372/26 X |
| 4,719,636 | 1/1988 | Yamaguchi | 372/26 X |
| 4,720,835 | 1/1988 | Akiba et al. | 372/50 |
| 4,759,023 | 7/1988 | Yamaguchi | 372/26 |
| 4,802,182 | 1/1989 | Thornton et al. | 372/26 X |
| 4,888,783 | 12/1989 | Kojima et al. | 372/26 X |
| 5,283,799 | 2/1994 | Jacquet et al. | 372/50 |
| 5,305,343 | 4/1994 | Allovon et al. | 372/50 |

FOREIGN PATENT DOCUMENTS 59-68988 4/1984 Japan .................. 372/50 X

OTHER PUBLICATIONS

Tanaka, et al., "5-Gb/s Performance of Integrated Light Source Consisting of λ/4-Shifted DFB Laser and EA Modulator with SI in InP BH Structure," *Journal of Lightwave Technology*, vol. 8, No. 9, Sep. 1990.

Hermes, T. "Novel Structure MQW Electroabsorption Modulator/DFB-Laser Integrated Device Fabricated by Selective Area MOCVD Growth," Electronics Letters, 7th Nov. 1991, vol. 27, No. 23.

*Primary Examiner*—Brian Healy
*Attorney, Agent, or Firm*—Leydig, Voit & Mayer

[57] ABSTRACT

An integrated semiconductor laser and light modulator includes a semiconductor substrate having a first surface, a semiconductor laser disposed on the first surface of the semiconductor substrate, an electric field absorption type light modulator passing and cutting off the light generated by the semiconductor laser, the semiconductor substrate including a groove opposite the modulator filled with a first semiconductor layer having a lattice constant smaller than that of the semiconductor substrate, having a surface coplanar with the first surface of the semiconductor substrate, and producing misfit dislocations at the growth interface, and a second semiconductor layer epitaxially grown on the first surface of the semiconductor substrate lattice matching with the semiconductor substrate. The electric field absorption type light modulator active layer is the part of the second semiconductor layer grown on the first semiconductor layer into which distortion is introduced by the dislocations, and the semiconductor laser is disposed on a different part of the first semiconductor layer. Therefore, the light generated in the semiconductor laser efficiently propagates into the light modulator.

8 Claims, 6 Drawing Sheets

SEMICONDUCTOR LASER WITH LIGHT MODULATOR

FIELD OF THE INVENTION

The present invention relates to a semiconductor laser with light modulator and, more particularly, to increased efficiency optical coupling between a semiconductor laser and a light modulator, and a production method therefor.

BACKGROUND OF THE INVENTION

Conventionally, an integrated semiconductor laser and electric field absorption type light modulator (hereinafter may be referred to as simply "modulator") on an InP substrate has been employed as a signal light source for high-speed modulation optical communication.

FIGS. 5(a) to 5(i) are diagrams illustrating process steps of a method for producing an integrated semiconductor laser and light modulator that has a long wavelength semiconductor laser and an electric field absorption type light modulator, described in Journal of Lightwave Technology, Vol. 8, No. 9, September 1990, pp. 1357 to 1362. FIGS. 5(a) to 5(d) are cross sections of the process steps, and FIGS. 5(e) to 5(i) are perspective views thereof.

A description will be given of the process steps.

First, as shown in FIG. 5(a), a $\Lambda/4$-shifted diffraction grating with 240 nm pitch 10a is formed in a region A where a semiconductor laser is to be formed on the (100) surface of an n-type InP substrate 10.

Secondly, as shown in FIG. 5(b), there are successively grown on the (100) surface of the n-type InP substrate 10 by liquid phase epitaxy (hereinafter referred to as LPE), an n-type InGaAsP light guiding layer 11 having the thickness of 0.1 $\mu$m and a bandgap energy corresponding to a wavelength $\Lambda$ of 1.3 $\mu$m, an undoped InGaAsP active layer 12 having the thickness of 0.1 $\mu$m and a bandgap energy corresponding to a wavelength $\Lambda$ of 1.57 $\mu$m, an undoped InGaAsP buffer layer 13 having the thickness of 0.1 $\mu$m and a bandgap energy corresponding to a wavelength $\Lambda$ of 1.3 $\mu$m, and a p-type InP layer 14 having the thickness of about 1 $\mu$m in this order, and further photoresist 15 is deposited on the p-type InP layer 14. After a portion of the photoresist 15 deposited on a region B where the light modulator is to be produced is removed by conventional photolithography, dry etching using the photoresist 15 as a mask is performed to the n-type InGaAsP light guiding layer 11, the undoped InGaAsP active layer 12, and the undoped InGaAsP buffer layer 13 and the p-type InP layer 14. As shown in FIG. 5(c), the region (B) on the n-type InP substrate 10 where the light modulator is to be produced is exposed.

Next, as illustrated in FIG. 5(d), an undoped InGaAsP light absorbing layer 16 having the thickness of 0.3 to 0.5 $\mu$m and a band energy corresponding to wavelength of 1.44 $\mu$m, an undoped InGaAsP buffer layer 17 having a thickness of 0.1 to 0.3 $\mu$m and a bandgap energy corresponding to a wavelength $\Lambda$ of 1.25 $\mu$m, and a p-type InP cladding layer 18 having a thickness of about 3 $\mu$m are successively produced by vapor phase epitaxy (hereinafter referred to as VPE), and further photoresist 19 is deposited on the p-type InP cladding layer 18.

After patterning the photoresist 19 in a stripe shape in the light waveguide direction of the semiconductor laser by conventional photolithography technique, as shown in FIG. 5(e), dry etching is performed to the above-described semiconductor layers grown on the substrate 10 using the patterned photoresist 19 as a mask, and the layers are formed in a mesa stripe 20 having a width of 2 $\mu$m.

Then, the undoped InGaAsP light absorbing layer 16, the undoped InGaAsP buffer layer 17 and the p-type InP cladding layer 18 which are grown on the region A on the substrate 10 where the semiconductor laser is to be formed are etched away, and a portion 18a of the InP cladding layer 18 grown on the region B on the substrate 10 where the light modulator is to be formed is etched away for electrical isolation, resulting in a state shown in FIG. 5(e).

Next, an Fe-doped InP layer 21 of high resistance is grown by VPE so as to bury the both sides of the mesa stride part 20 and the part 18a which is a portion of the InP cladding layer 18 etched away for electrical isolation as shown in FIG. 5(f), and an undoped InGaAs contact layer 22 is grown thereon by VPE.

P-type diffused regions 26a and 26b are respectively formed by selective diffusion of Zn at opposite sides of a stripe portion of the Fe-doped InP layer 21 and the undoped InGaAs contact layer 22 formed on the mesa stripe part 20, so that deepest parts of the p-type diffused regions reach the mesa stripe part 20. Then, a selective etching is carried out so that only a portion of the InGaAs contact layer 22 formed on the mesa stripe part 20 remains, thereby resulting in a state illustrated in FIG. 5(g).

Next, a SiN film 23 is deposited over the InGaAs contact layer 22 and the Fe-doped InP layer 21, and conventional photolithography and etching are performed to form openings 23a and 23b in the SiN film 23 as illustrated in FIG. 5(h).

Then, as shown in FIG. 5(i) a p-side electrode formation metal layer is forming on the SiN film 23 in the openings 23a and 23b, and this metal layer is patterned so that the portions of the metal layer buried in the openings 23a and 23b and peripheral portions thereof remain, thereby forming a p-side electrode 24a for the semiconductor laser and a p-side electrode 24b l for the light modulator.

Additionally, an n-side electrode 25 is formed on the rear surface of the substrate 10, completing an integrated semiconductor laser and light modulator on the same substrate.

In the above-described semiconductor laser with light modulator, the energy band gap of the undoped InGaAsP light absorbing layer 16 of the light modulator side is larger than that of the active layer 12 of the semiconductor laser side. Therefore the light generated in the active layer 12 in the mesa stripe part 20 of the semiconductor laser side propagates to the undoped InGaAsP light absorbing layer 16 of the light modulator side, and the laser beam is emitted from the cleaved facet of this undoped InGaAsP light absorbing layer 16. During this operation, by switching between applying a voltage and applying no voltage across the p-side electrode 24b of the light modulator side and the n-side electrode 25, i.e., switching between applying an electric field and applying no electric field to the undoped InGaAsP light absorbing layer 16, the energy band gap of the undoped InGaAsP light absorbing layer 16 becomes larger or smaller than that of the active layer 12 in the semiconductor laser. Thereby, the light generated in the active layer 12 is insuccessively cut off in the light modulator and emitted from the cleaved facet of the undoped InGaAsP light absorbing layer 16, generating an optical signal having a transmission capacity of, for example, 5 Gb/s.

The semiconductor laser with light modulator fabricated by the above-described process steps illustrated in FIGS. 5(a) to 5(i) involves the following problems. That is, because the light absorbing layer 16 of the light modulator and the active layer 12 of the semiconductor laser are produced on the semiconductor substrate 10 with different semiconductor layers grown by the different epitaxial growth processes, coupling loss unfavorably occurs when the light generated by the semiconductor laser propagates to the light modulator, thereby hardly outputting a stable optical signal.

On the other hand, it is are known that when semiconductor layers are epitaxially grown by metal organic chemical vapor deposition (hereinafter referred to as "MOCVD") in a state where a prescribed region on the semiconductor substrate is covered with an insulating film such as $SiO_2$ film and SiN film, source gases directly supplied to the front surface of the semiconductor substrate are thermally decomposed on the substrate and epitaxially grow materials, while source gases supplied to the $SiO_2$ film or SiN film do not react thereon, and are diffused over the $SiO_2$ film or SiN film and move to a location where the semiconductor substrate is exposed, and are thermally decomposed on the semiconductor substrate to produce epitaxially grown material. During this epitaxial growth, due to the above-described nature, there is a difference in the amount of the existing source gases contributing to the epitaxial growth per unit time at a position close to the $SiO_2$ film or SiN film and at a position remote from the film on the substrate. As a result, there is a difference in the growth speed of the semiconductor layers at a position close to the $SiO_2$ film or SiN film and at a position remote therefrom, leading a difference in the thickness of the grown semiconductor layers, thereby resulting in thick semiconductor layers grown at a position close to the $SiO_2$ or SiN film and thin semiconductor layers grown at a position remote from the film.

Recently, utilizing the nature as described above, that there occurs a difference in the thickness of the semiconductor layers when the semiconductor layers are epitaxially grown by MOCVD with a prescribed region of the substrate covered with the $SiO_2$ or SiN film, a method of producing a semiconductor laser with light modulator that produces semiconductor layers of the semiconductor laser and those of the light modulator in the same epitaxial growth step has been provided.

Next, a description will be given of this production method.

FIGS. 6(a) to 6(c) are diagrams illustrating process steps of a method for producing a semiconductor laser with light modulator, described in ELECTRONICS LETTERS 7 Nov. 1991 Vol. 27, No. 23, pp. 2138 to 2140. FIGS. 6(a) and 6(b) are perspective views and FIG. 6(c) is a cross section. Enlarged views D and C in FIG. 6(b) respectively show layer structures of the semiconductor laser and the light modulator.

First, as shown in FIG. 6(a), a diffraction grating 31 is produced in a prescribed region on an InP substrate 30 where the semiconductor laser is to be produced (this side of paper surface of the figure is a region where the light modulator is to be formed). Then, $SiO_2$ films 32 of a stripe shape parallel to the light waveguide direction of the semiconductor laser to be produced are formed so as to sandwich this diffraction grating 31. Secondly, as shown in FIG. 6(b), the semiconductor layers are successively grown by MOCVD in the order of InGaAsP light guiding layer 33a (semiconductor laser side) and 33b (light modulator side), InGaAs/InGaAsP multi-quantum well active layer 34a (semiconductor laser side) and 34b (light modulator side), and InP cladding layer 35a (semiconductor laser side) and 35b (light modulator side). Thereafter, as shown in FIG. 6(c), an InGaAsP layer is disposed on the InP cladding layers 35a and 35b, a prescribed portion of the InGaAsP layer is removed to form a separating groove 37, and InGaAsP cap layers 36a of the semiconductor laser side and 36b of the light modulator side are produced. Next, a p-side and an n-side electrode 38a and 38b are formed respectively on the InGaAsP cap layers 36a of the semiconductor laser side and 36b of the light modulator side. Further, an electrode of opposite conductivity type to that of the electrodes 38a and 38b is formed at the rear surface side of the substrate 30, completing the integrated semiconductor laser and light modulator on the same substrate.

In the semiconductor laser with light modulator obtained by such a production process, the thickness of the well layer 34c1 of the multi-quantum well active layer 34a of the semiconductor laser side is larger than that of the well layer 34c2 of the multi-quantum well active layer 34b of the light modulator side caused by the above-described nature, as illustrated in FIG. 6(b). Thereby, the energy band gap of the multi-quantum well active layer 34b of a light absorbing layer of the light modulator side is larger than that of the multi-quantum well active layer 34a of the semiconductor laser side. Therefore, the light generated in the multi-quantum well active layer 34a of the semiconductor laser side propagates to the multi-quantum well active layer 34b of the light modulator side and is modulated by the light modulator according to the same principle as the above-described semiconductor laser with light modulator shown in FIGS. 5(a) to 5(i).

In the semiconductor laser with light modulator fabricated by the prior art production process shown in FIGS. 6(a) to 6(c), since the active layer of the semiconductor laser side and the active layer of the light modulator side (i.e., the light absorbing layer) comprise a continuous semiconductor layer produced in a single process step, the laser beam generated in the semiconductor laser can propagate to the light modulator more efficiently relative to the semiconductor laser with light modulator fabricated by the production process shown in FIGS. 5(a) to 5(i). In such a method which, utilizing the difference in the amount of the existing source gases contributing to the epitaxial growth at position close to and at a position remote from the $SiO_2$ film on the substrate, a large difference in the layer thickness is generated in the grown semiconductor layers thereby to form portions having a large energy band gap and a small energy band gap in the semiconductor layers. However, the thicknesses of the semiconductor layers of the semiconductor laser part and those of the semiconductor layers of the light modulator part are considerably different from each other. Therefore, the multi-quantum well active layers 34a and 34b are disposed on levels having a difference generated due to the difference in the thicknesses of the light guiding layers 33a and 33b as illustrated in FIG. 6(c). Therefore, there also occurs a difference in level between the multi-quantum well active layers 34a and 34b, and this difference in level interrupts the propagation of the laser beam, not sufficiently improving the propagation characteristic of the laser beam between the active layer of the semiconductor laser and the light absorbing layer of the light modulator.

When the semiconductor layers are epitaxially grown by MOCVD with the SiO2 film at a prescribed region on the semiconductor substrate, and the growth environment including, for example, the temperature and the pressure in a reactive tube changes during the growth by even only a little, the behavior of the source gases at the SiO2 film unfavorably changes to a great extent even if the flow rates of the source gases are constant. Therefore, it is impossible to produce by this method a difference in the thickness of the semiconductor layers grown, that produces a desired difference in the energy band gap with a good reproducibility, and therefore it is impossible to produce an integrated semiconductor laser and light modulator having a desired operation characteristic at a high yield.

SUMMARY OF THE INVENTION

It is an object of the present invention to provide a semiconductor laser with light modulator that can improve a propagation characteristic of the laser beam between an active layer of a semiconductor laser and a light absorbing layer of a light modulator.

It is another object of the present invention to provide a method for producing a semiconductor laser with light modulator having an improved efficiency of light coupling between an active layer of a semiconductor laser and a light absorbing layer of a light modulator and having a desired operation characteristic with a good reproducibility.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to the present invention, in a semiconductor laser with light modulator in a state where a prescribed portion of a semiconductor substrate or a semiconductor layer formed on the semiconductor substrate lattice matching with the semiconductor substrate is removed and a semiconductor layer having a lattice constant smaller than that of the semiconductor substrate is grown to replace the removed portion so as to keep the original lattice constant of the semiconductor layer, a semiconductor layer lattice matching with the semiconductor substrate is epitaxially grown on the semiconductor substrate with portions having a smaller energy band gap and a larger energy band gap, and a light modulator is fabricated on the portion of the semiconductor layer having a larger energy band gap and a semiconductor laser is fabricated on the portion of the semiconductor layer having a smaller energy band gap.

In this construction, distortions due to compressive stress are applied to a portion grown on the region of the semiconductor layer having a smaller lattice constant and no distortion is applied to a portion grown on the other region, whereby portions having a larger energy band gap and a smaller energy band gap with different energy band structures are produced in the semiconductor layer. Therefore, in contrast to the prior art that produces portions having a larger energy band gap and a smaller energy band gap in the semiconductor layer by positively generating a difference in the layer thickness of a semiconductor layer, portions having a larger energy band gap and a smaller energy band gap can be produced in the semiconductor layer that is grown in an almost uniform thickness, whereby an active layer of the semiconductor laser and a light absorbing layer of a light modulator can be fabricated in the same semiconductor layer having a small difference in level, where the light generated in the semiconductor laser efficiently propagates to the light modulator.

In addition, since the source gases contributing to the growth are uniformly present on the front surface of the semiconductor substrate during growth of the semiconductor layers, and variations in the composition and thickness of layers grown over the different regions on the substrate are small, semiconductor layers having a desired difference in the energy band gap are produced with good reproducibility, thereby producing a device having a desired operation characteristics with good reproducibility.

DETAILED DESCRIPTION OF THE PREFERRED EMBODIMENTS

Embodiment 1

Figure 1:
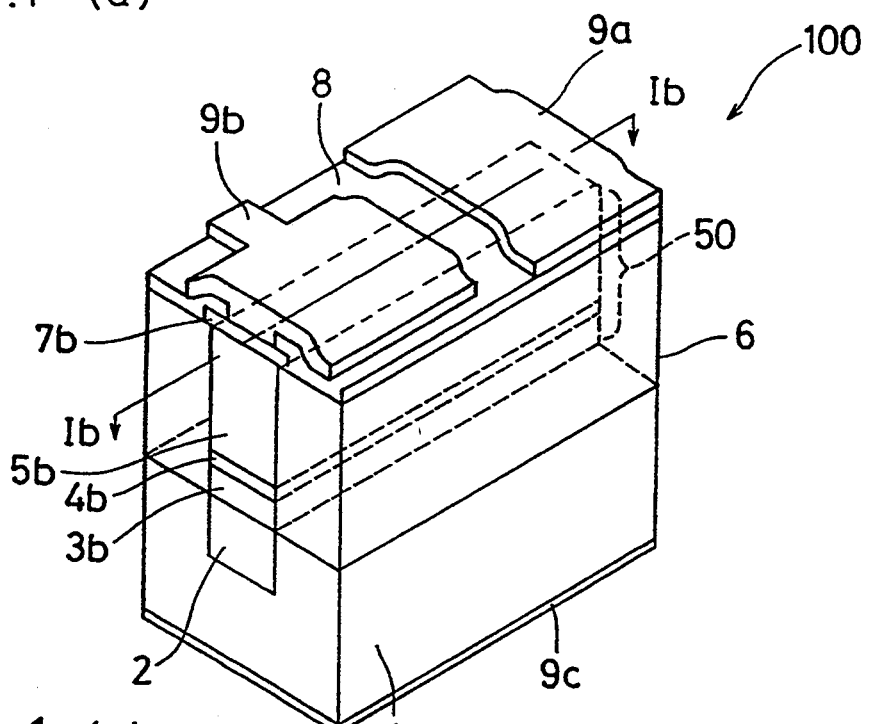
FIGS. 1(a) and 1(b) are a perspective view and a cross sectional view illustrating a semiconductor laser with light modulator in accordance with a first embodiment of the present invention, respectively.
Figure 1:
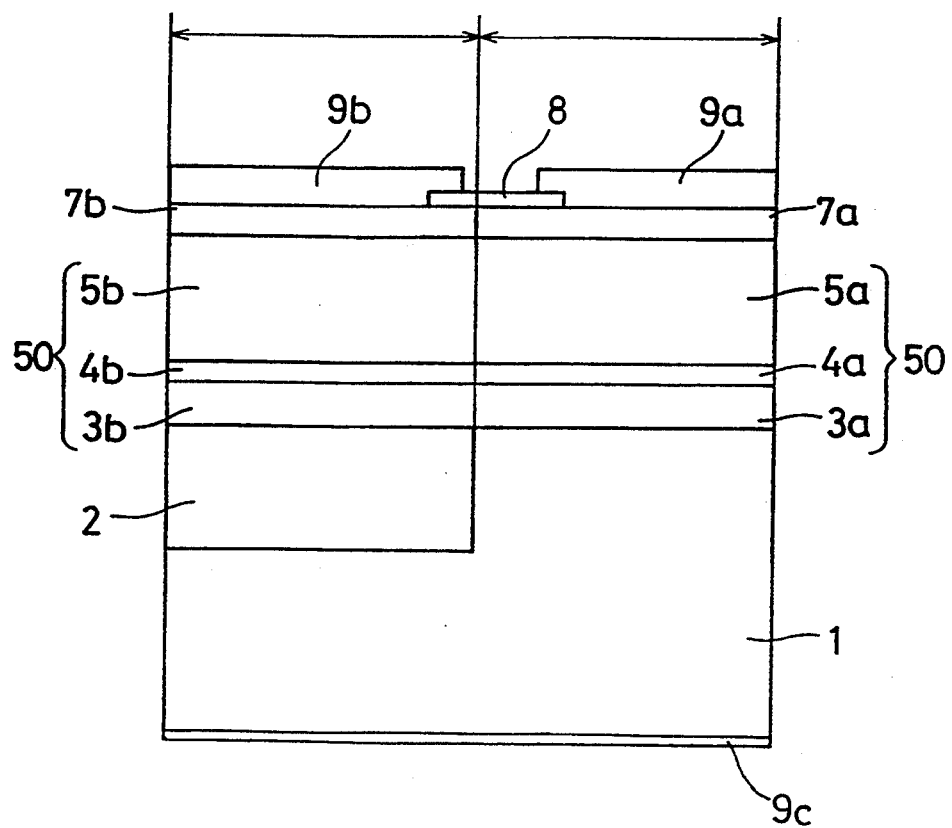

FIGS. 1(a) and 1(b) are diagrams illustrating a semiconductor laser with light modulator in accordance with a first embodiment of the present invention, FIG. 1(a) is a perspective view thereof and FIG. 1(b) is a cross sectional view taken along a line Ib—Ib in FIG. 1(a). In the figures, a prescribed portion at a side of an n-type InP substrate 1 is etched in a stripe shape having a prescribed depth, and an n-type GaInP layer 2 having a lattice constant smaller than that of the InP substrate 1 is disposed in this portion. In a mesa stripe part 50, an n-type InP buffer layer 3a is disposed on the front surface of the n-type InP substrate 1 and an n-type InP buffer layer 3b is disposed on the n-type GaInP layer 2. An undoped InGaAsP active layer 4a is disposed on the n-type InP buffer layer 3a and an undoped InGaAsP light absorbing layer 4b is disposed on the n-type InP buffer layer 3b. A p-type InP cladding layer 5a is disposed on the undoped InGaAsP active layer 4a and a p-type InP cladding layer 5b is disposed on the undoped InGaAsP light absorbing layer 4b. Fe-doped InP current blocking layers 6 are disposed at the both sides of the mesa stripe part 50 and p-type InGaAs contact layers 7a and 7b of a stripe shape are disposed on the mesa stripe part 50 and a portion thereof on a portion of the Fe-doped InP blocking layer 6. A SiN film pattern 8 covers a boundary portion (a connecting portion) between the p-type InGaAs contact layers 7a and 7b, and the top surfaces of the Fe-doped InP current blocking layers 6. A p-side electrode 9a is disposed on the SiN film pattern 8 so that a portion of the electrode 9a is in contact with the top surface of the p-type InGaAs contact layer 7a, and a p-side electrode 9b is disposed on the SiN film pattern 8 so that a portion of the electrode 9b is in contact with the p-type InGaAs contact layer 7b. An n-side electrode 9c is disposed on the rear surface of the n-type InP substrate 1. Here, a portion which is produced on the front surface of the n-type InP substrate 1 in the mesa stripe part 50, i.e., the n-type InP buffer layer 3a, the undoped InGaAsP active layer 4a and the p-type InP cladding layer 5a serve as an operating layer of the semiconductor laser, and the operating layer, the p-type InGaAs contact layer 7a, the p-side electrode 9a and the n-side electrode 9c form a semiconductor laser. A portion which is produced on the n-type GaInP layer 2 in the mesa stripe part 50, i.e., the n-type InP buffer layer 3b, the undoped InGaAsP light absorbing layer 4b and the p-type InP cladding layer 5b serve as an operating layer of the light modulator, and this operating layer, the p-type InGaAs contact layer 7b, the p-side electrode 9b and the n-side electrode 9c form a light modulator.

FIGS. 2(a) to 2(g) are perspective views illustrating process steps of a method for producing the semiconductor laser with light modulator of FIGS. 1(a) and 1(b). A description is given of the process steps of a method for producing the semiconductor laser with light modulator of FIGS. 1(a) and 1(b) with reference to these figures. A more detailed description is particularly given of the internal structure.

Figure 2:
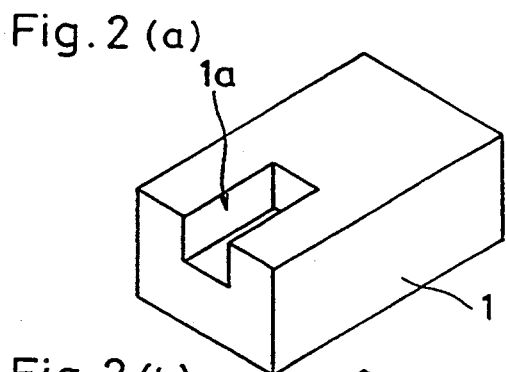
FIGS. 2(a) to 2(g) are perspective views illustrating process steps of a method for producing the semiconductor laser with light modulator of FIGS. 1(a) and 1(b)
Figure 2:
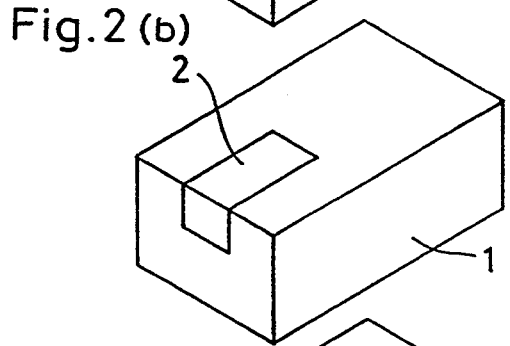
Figure 2:
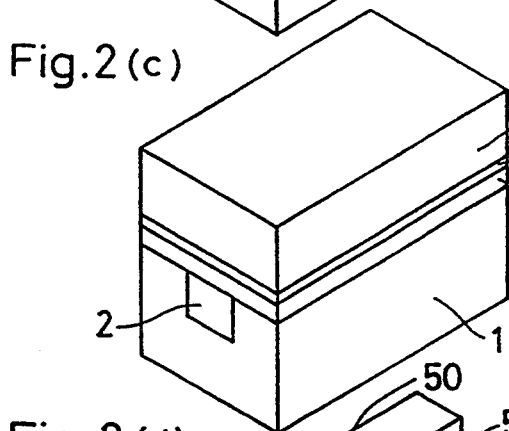
Figure 2:
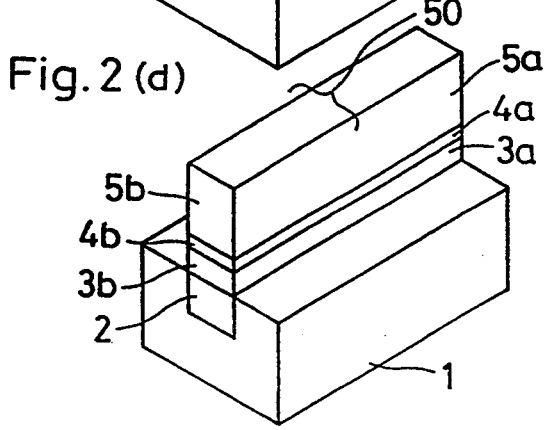
Figure 2:
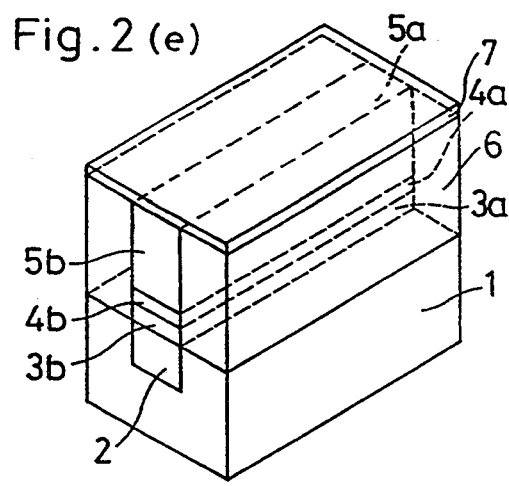
Figure 2:
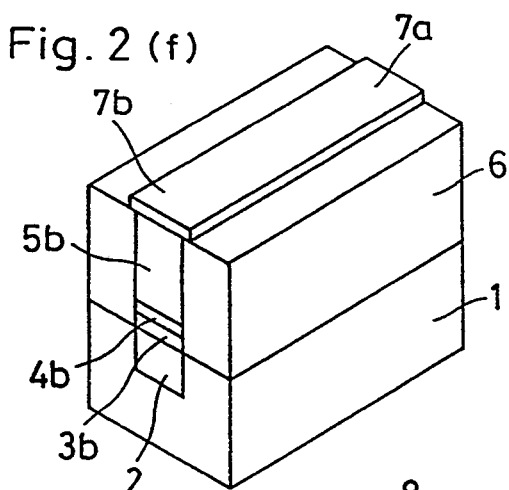
Figure 2:
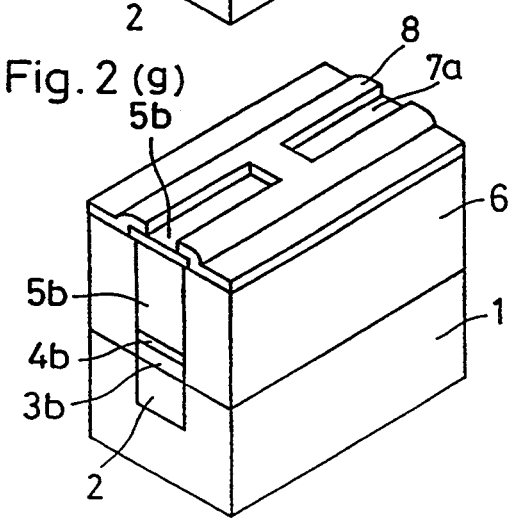

First, as shown in FIG. 2(a), a portion at one side of the n-type InP substrate 1 where the light modulator is to be formed, is etched to a prescribed depth, forming a stripe shaped recess 1a. Secondly, as shown in FIG. 2(b), by vapor phase epitaxy (hereinafter referred to as VPE) the n-type GaInP layer 2 is grown filling the recess 1a. Here, the depth of the stripe shaped recess 1a is set so that the n-type GaInP layer 2 is grown to have a thickness larger than a critical layer thickness that generates misfit dislocations at its growth interface and maintains the original lattice constant of GaInP. Therefore, the n-type GaInP layer 2 has a lattice constant smaller than that of the n-type InP substrate 1. Thirdly, as shown in FIG. 2(c), on the n-type InP substrate 1 where this n-type GaInP layer 2 is grown, there are epitaxially grown by VPE an n-type InP layer 3, an undoped InGaAsP layer 4 and a p-type InP layer 5 so that the total thickness of the layers is smaller than the critical layer thickness that generates misfit dislocations at the growth interface. Here, since the n-type GaInP layer 2 has a lattice constant smaller than that of the n-type InP substrate 1, a compressive stress is applied to portions of the n-type InP layer 3, the undoped InGaAsP layer 4 and the p-type InP layer 5 which are grown on the n-type GaInP layer 2 and lattice-match with InP, where distortions are generated therein, while distortions are not generated in the other portions of the layers. Therefore, at the portions of the n-type InP layer 3, the undoped InGaAsP layer 4 and the p-type InP layer 5 which are grown on the n-type GaInP layer 2, the energy band structures are deformed due to the distortions, and the energy band gaps thereof are larger than those of the portions grown on the front surface of the n-type InP substrate 1. Heretofore, it is preferable that there be a difference in the energy band gap exceeding 20 meV between the light modulator and the semiconductor laser in the integrated semiconductor laser and light modulator so that the light modulator efficiently absorbs the laser beam generated in the semiconductor laser. In this embodiment, the Ga composition of the n-type GaInP layer 2 is above 0.047, where the energy band gaps of the portions grown on the GaInP layer 2 are larger than those grown on the n-type InP substrate 1 by 20 meV or more. Further, as described above, the total thickness of the n-type InP layer 3, the undoped InGaAsP layer 4 and the p-type InP layer 5 should be a thickness that does not relieve the distortions once introduced into these layers, i.e., a thickness smaller than the critical layer thickness that does not generate misfit dislocations, and the larger the Ga composition of the n-type GaInP layer 2 is, the smaller critical layer thickness is. On the other hand, in order to realize stable laser oscillation of the semiconductor laser, it is preferable that the total thickness of the n-type InP layer 3, the undoped InGaAsP layer 4 and the p-type InP layer 5 grown on the substrate exceeds 1.5 μm. For the above-described reason, in this embodiment the Ga composition is within a range of 0.047 to 0.05, the difference in the energy band gap between the active layer of the semiconductor laser and the light absorbing layer of the light modulator exceeds 20 meV, and the total thickness of the n-type InP layer 3, the undoped InGaAsP layer 4 and the p-type InP layer 5 exceeds 1.5 μm.

Next, as shown in FIG. 2(d), by employing conventional photolithography and etching technique, leaving portions of the n-type InP layer 3, the undoped InGaAsP layer 4 and the p-type InP layer 5 grown on the stripe shaped recess 1a (n-type GaInP layer 2), and parts connected thereto extending in the longitudinal direction of the stripe shaped recess 1a (n-type GaInP layer 2), the other portions of the layers are etched, thereby forming the mesa stripe part 50. Here, in the figures subsequent to FIG. 2(d), since the n-type InP layer 3, the undoped InGaAsP layer 4 and the p-type InP layer 5 have a difference in the energy band gap between the portion grown on the n-type GaInP layer 2, i.e., the region where the light modulator is formed, and the portion grown on the n-type InP substrate 1, i.e., the region where the semiconductor laser is to be formed as described above, portions of the n-type InP layer 3 grown on the n-type InP substrate 1 and the n-type GaInP layer 2 are represented in the figure as the n-type InP buffer layers 3a and 3b, respectively, portions of the undoped InGaAsP layer 4 grown on the n-type InP buffer layers 3a and 3b are represented in the figure as the undoped InGaAsP active layer 4a and the undoped InGaAsP light absorbing layer 4b, respectively, and portions of the p-type InP layer 5 grown on the undoped InGaAsP active layer 4a and the undoped InGaAsP light absorbing layer 4b are represented in the figure as the p-type InP cladding layers 5a and 5b, respectively, so as to distinguish portions for the semiconductor laser side and for the light modulator side.

Next, as shown in FIG. 2(e), the Fe-doped InP blocking layers 6 are selectively epitaxially grown by VPE at opposite sides of the mesa stripe part 50, and subsequently a p-type InGaAsP layer 7 is epitaxially grown to cover the mesa stripe part 50 and the Fe-doped InP blocking layers 6. Then, as shown in FIG. 2(f), by conventional photolithography and etching technique, leaving a portion of the p-type InGaAsP layer 7 disposed on the mesa stripe part 50 and a portion thereof on a portion of the Fe-doped InP blocking layer 6, the other portion of the InGaAsP layer 7 is etched, thereby forming the p-type InGaAsP contact layers 7a and 7b. Here, reference numerals 7a and 7b are used to designate portions of the contact layer for the semiconductor laser and for the light modulator. Further, a SiN film is deposited on the top surfaces of the p-type InGaAsP contact layers 7a and 7b and the Fe-doped InP blocking layers 6, and patterned by conventional photolithography and etching techniques, as shown in FIG. 2(g), forming the SiN film pattern 8 having apertures through which the top surfaces of the p-type InGaAsP contact layers 7a and 7b are respectively exposed. Then, on the SiN film pattern 8 a metal film comprising, for example, Au-Zn/Au, is deposited and patterned in a desired configuration, thereby forming separately the p-side electrode 9a for the semiconductor laser and the p-side electrode 9b for the light modulator. Further, on the rear surface of the n-type InP substrate 1 a metal film comprising, for example, Au-Ge/Au, is deposited, completing the semiconductor laser with light modulator that has the semiconductor layers (operating layers) for the semiconductor laser and the light modulator grown on the semiconductor substrate in one step, as illustrated in FIG. 1(a).

Next, a description is given of the operation.

The operation of this semiconductor laser with light modulator is fundamentally the same as that of the conventional semiconductor laser. The energy band gap of the light absorbing layer of the light modulator side is larger than that of the active layer of the semiconductor laser side. The light generated in the active layer 4a of the semiconductor laser side in the mesa stripe part 50 propagates to the light absorbing layer 4b of the light modulator side, and a laser beam is emitted from the cleaved facet of the light absorbing layer 4b. During this operation, by switching between applying a voltage and applying no voltage between the p-side electrode 9b of the light modulator side and the n-side electrode 9c, i.e., switching between applying an electric field and applying no electric field to the InGaAsP light absorbing layer 4b, the energy band gap of the light absorbing layer 4b becomes larger or smaller than that of the active layer 4a of the semiconductor laser. The light generated in the active layer 4a is intermittently cut off by the light modulator and emitted from the cleaved facet of the light absorbing layer 4b, generating an optical signal having transmission capacity of, for example, 5 Gb/s.

In the production process steps of the semiconductor laser with light modulator of this embodiment, the n-type GaInP layer 2 is grown, filling a prescribed region of the n-type InP substrate 1, i.e., a region where the light modulator is to be formed, thereby making the lattice constant of this region smaller than that of the n-type InP substrate 1. In this state the n-type InP layer 3, the undoped InGaAsP layer 4 and the p-type InP layer 5 are epitaxially grown on the n-type InP substrate 1. Therefore, the compressive stress due to lattice mismatch in the direction parallel to the top surface of the n-type InP substrate 1 is applied to the portion of the semiconductor n-type GaInP layer 2 that is grown on the n-type InP substrate 1, where distortions are introduced, and the energy band gap of this portion is made larger than that of the other portion. As a result, the portions having a difference in the energy band gap are produced without generating a large difference in the layer thickness of the semiconductor layers, thereby forming the active layer of the semiconductor laser and the light absorbing layer of the light modulator with a small difference in level in the semiconductor layer. Therefore, this semiconductor laser with light modulator can improve the efficiency of the propagation of the laser beam generated in the semiconductor laser to the light modulator relative to the prior art laser.

Since the source gases contributing to the growth of the semiconductor layers are uniformly present on the front surface of the n-type InP substrate 1 and the growth speed of the semiconductor layers is constant between the different regions on substrate, the variations in the composition and thickness of the semiconductor layers grown are small, and the semiconductor layers having a desired difference in the energy band gap can be stably produced, thereby also increasing production efficiency relative to the prior art laser.

Embodiment 2

Figure 3:
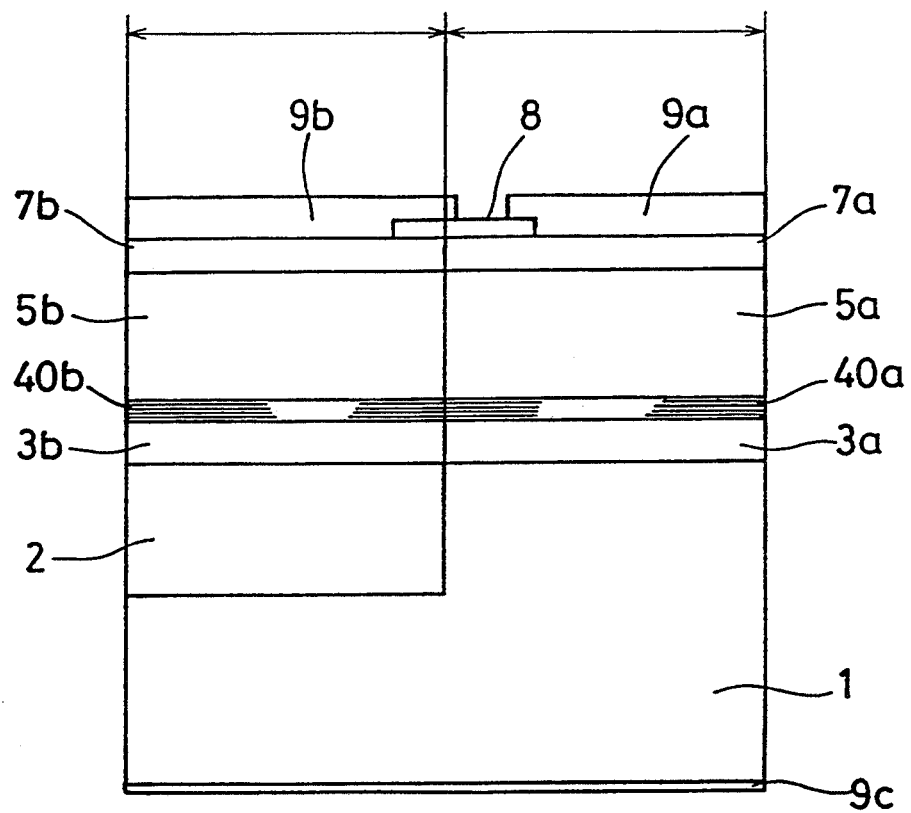
FIG. 3 is a cross sectional view illustrating a semiconductor laser with light modulator in accordance with a second embodiment of the present invention.

FIG. 3 is a cross sectional view illustrating a semiconductor laser with light modulator in accordance with a second embodiment of the present invention. In the figure, the same reference numerals as those of FIGS. 1(a) and 1(b) designate the same or corresponding parts. In this semiconductor laser with light modulator, in place of the undoped InGaAsP active layer 4a and the undoped InGaAsP light absorbing layer 4b of the semiconductor laser with light modulator of the above-described first embodiment, an InGaAs/InGaAsP multi-quantum well active layer 40a and an InGaAs/InGaAsP multi-quantum well light absorbing layer 40b, grown by the same epitaxial growth in one step, are employed.

Process steps of a method for producing this semiconductor laser are fundamentally the same as those of the semiconductor laser with light modulator of the first embodiment. After growing the n-type InP buffer layers 3a and 3b in one step, the InGaAs/InGaAsP multi-quantum well active layer 40a and the InGaAs/InGaAsP multi-quantum well light absorbing layer 40b are grown in one step, and the other processes are the same as those of the first embodiment.

In the semiconductor laser of this second embodiment, when an electric field is applied to the InGaAs/InGaAsP multi-quantum well light absorbing layer 40b, the change in the energy band gap is steep due to the quantum confining Stark effect. As a result, the laser beam propagated from the semiconductor laser is efficiently modulated and a stable optical signal is generated.

Embodiment 3

FIGS. 4(a) to 4(e) are perspective views illustrating process steps of a method for producing a semiconductor laser with light modulator in accordance with a third embodiment of the present invention. In the figures, the same reference numerals as those of FIGS. 1(a) and 1(b) designate the same or corresponding parts.

A description will be given of the process steps.

Figure 4:
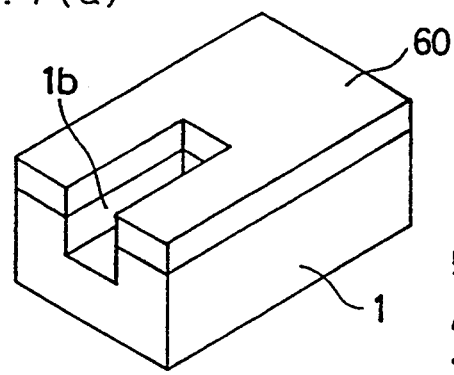
FIGS. 4(a) to 4(e) are perspective views illustrating process steps of a method for producing a semiconductor laser with light modulator in accordance with a third embodiment of the present invention.
Figure 4:
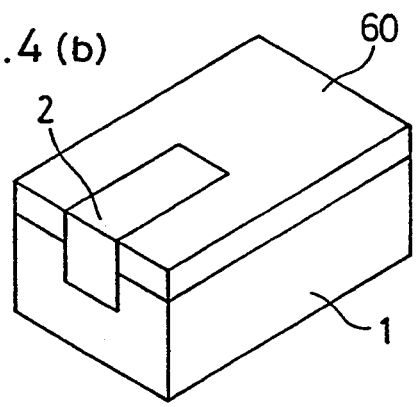
Figure 4:
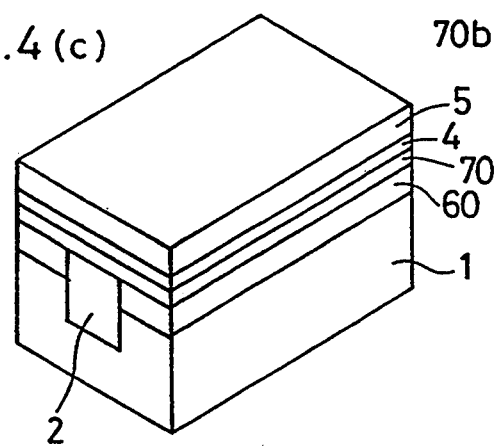
Figure 4:
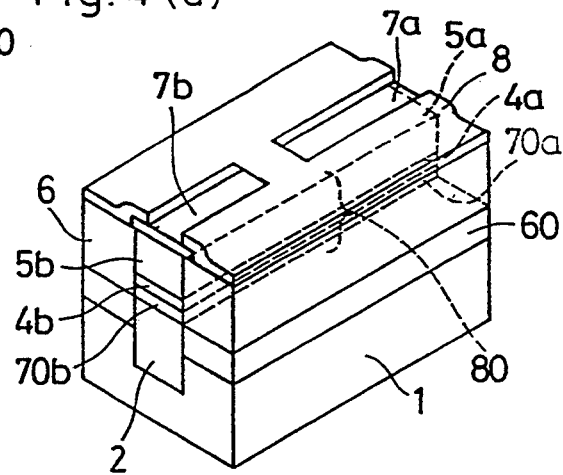
Figure 4:
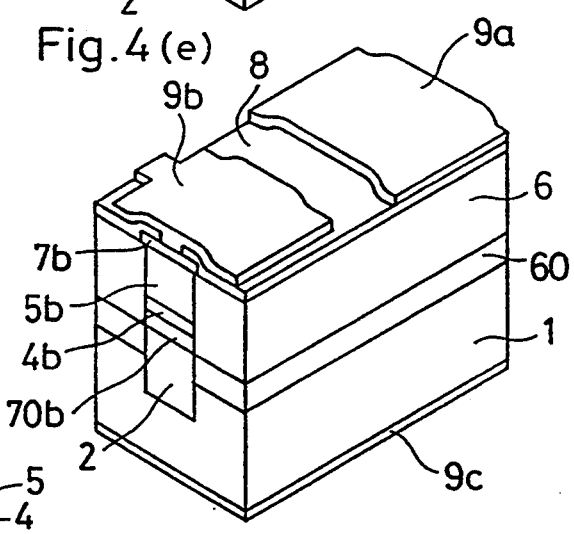
Figure 5A:
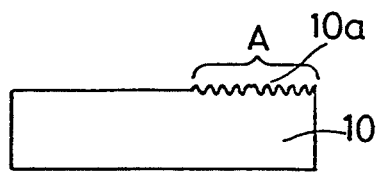
FIGS. 5(a)-5(d) and 5(e)-5(i) are cross sectional views and perspective views illustrating process steps of a method for producing a prior art semiconductor laser with light modulator, respectively.
Figure 5B:
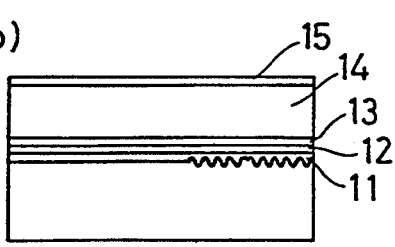
Figure 5C:
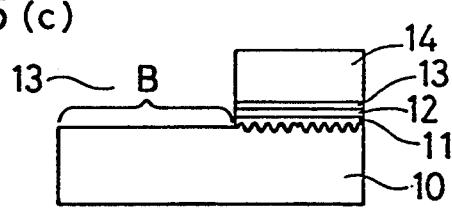
Figure 5D:
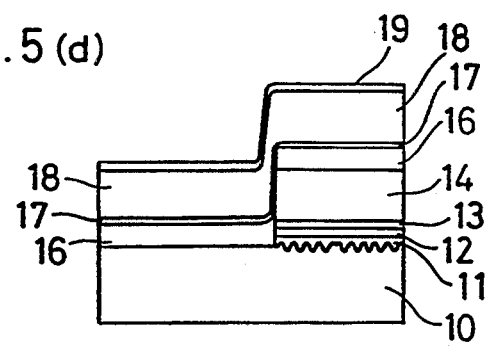
Figure 5E:
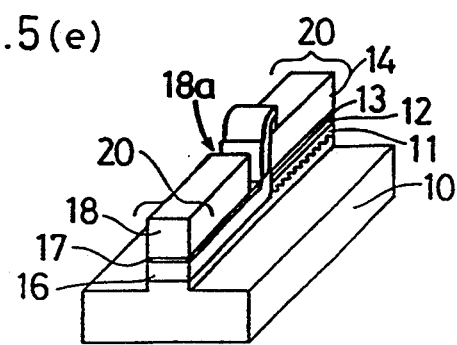
Figure 5F:
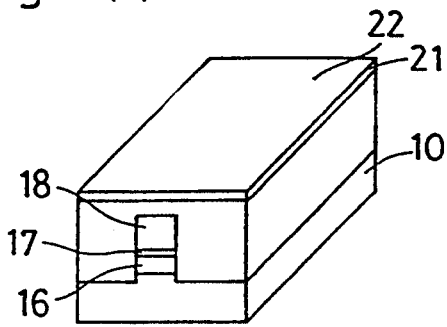
Figure 5G:
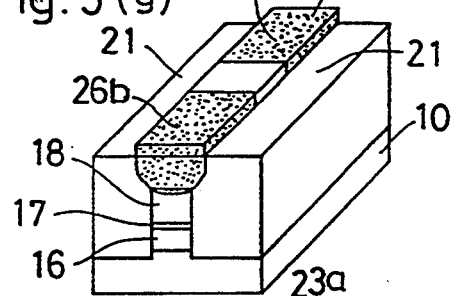
Figure 5H:
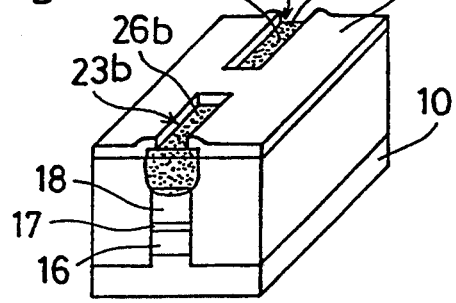
Figure 5I:
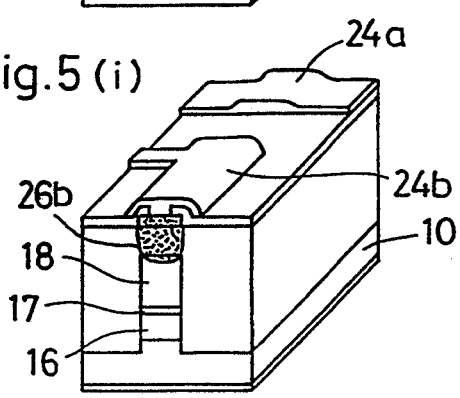
Figure 6:
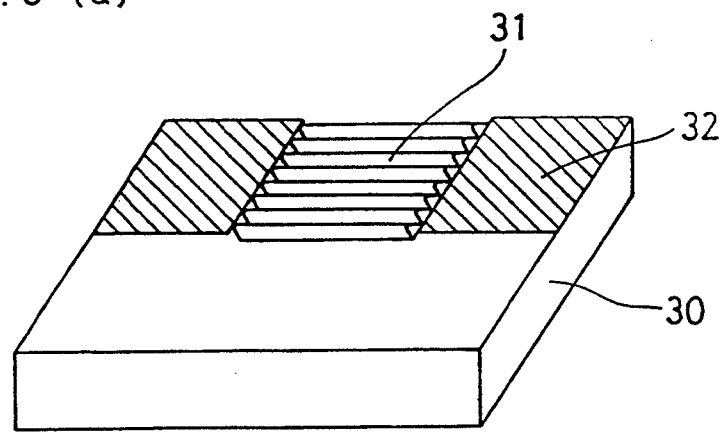
FIGS. 6(a) and 6(b), and 6(c) are perspective views and a cross sectional view illustrating process steps in a method for producing the prior art semiconductor laser with light modulator, respectively.
Figure 6:
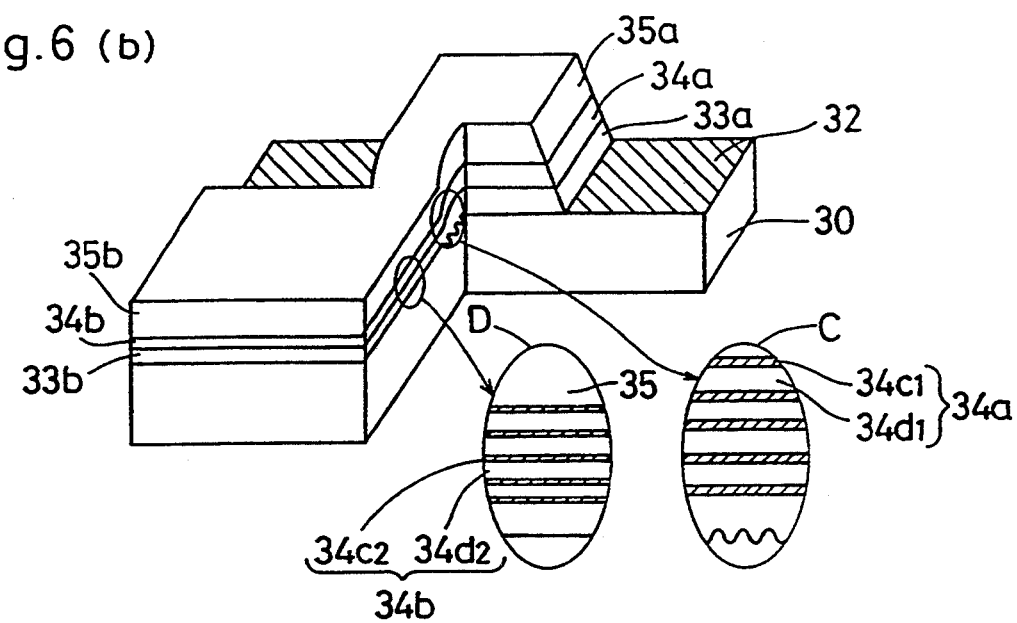
Figure 6:
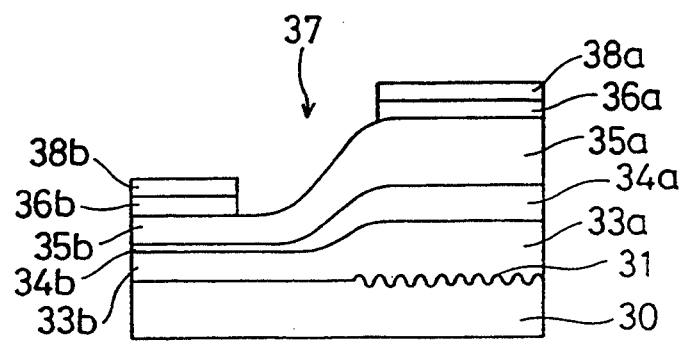

First, after a first n-type InP buffer layer 60 is epitaxially grown on the n-type InP substrate 1 by VPE, as shown in FIG. 4(a), at one side where the light modulator is to be formed the n-type InP substrate 1 and the first n-type InP buffer layer 60 are etched to a prescribed depth, forming a stripe shaped recess 1b. Secondly, as shown in FIG. 4(b) the n-type GaInP layer 2 is grown by VPE burying this stripe shaped recess 1b. Thereafter, as shown in FIG. 4(c), on the first n-type InP buffer layer 60 there are epitaxially grown by VPE a second n-type InP buffer layer 70, the undoped InGaAsP layer 4 and the p-type InP layer 5 so that the total thickness of the layers is smaller than the critical layer thickness that generates misfit dislocations at the growth interface. Next, by conventional photolithography and etching technique, leaving portions of the second n-type InP buffer layer 70, the undoped InGaAsP layer 4 and the p-type InP layer 5 grown on the stripe shaped recess 1b (n-type GaInP layer 2) and parts connected thereto extending in the longitudinal direction of the stripe shaped recess 1b (n-type GaInP layer 2), the other portions of the layers are etched, thereby forming the mesa stripe part 80. Next, similar to the first embodiment, the Fe-doped InP blocking layers 6 are selectively epitaxially grown by VPE at opposite sides of the mesa stripe part 80, and subsequently a p-type InGaAsP layer is epitaxially grown to cover the top surfaces of the mesa stripe part 80 and the Fe-doped InP blocking layer 6. Then, by conventional photolithography and etching technique, leaving a portion of the p-type InGaAsP layer disposed on the mesa stripe part 80 and a portion thereof on a portion of the Fe-doped InP blocking layer 6, the InGaAsP layer is etched and patterned, thereby forming the p-type InGaAsP contact layers 7a and 7b. Further, the SiN film pattern 8 is formed with apertures through which the front surfaces of the p-type InGaAsP contact layers 7a and 7b are separately exposed, where a state illustrated in FIG. 4(d) is obtained.

Then, as shown in FIG. 4(e), on the SiN film pattern 8 a metal film comprising, for example, Au-Zn/Au is deposited and patterned in a desired configuration, forming separately the p-side electrode 9a for the semiconductor laser and the p-side electrode 9b for the light modulator. Furthermore, on the rear surface of the n-type InP substrate 1, a metal film comprising, for example, Au-Ge/Au is deposited to produce the n-type electrode 9c, completing the semiconductor laser with light modulator.

In the figures, portions of the second n-type InP buffer layer 70 grown on the first n-type InP buffer layer 60 and on the n-type GaInP layer 2 are represented as the second n-type InP buffer layers 70a and 70b, respectively, portions of the undoped InGaAsP layer 4 grown on the second n-type InP buffer layers 70a and 70b are represented as the undoped InGaAsP active layer 4a and the undoped InGaAsP light absorbing layer 4b, respectively, and portions of the p-type InP layer 5 grown on the undoped InGaAsP active layer 4a and the undoped InGaAsP light absorbing layer 4b are represented as the p-type InP cladding layers 5a and 5b, respectively, so as to distinguish portions for the semiconductor laser side and for the light modulator side, similarly to the first embodiment.

In addition, in the above-described process steps, similar to the recess 1a in the first embodiment, the stripe shaped recess 1b is produced in a depth so that the n-type GaInP layer 2 has a thickness larger than a critical layer thickness that generates misfit dislocations in the layer itself and that makes the GaInP layer 2 maintain the original lattice constant of GaInP.

Similar to the first embodiment, the Ga composition of the n-type GaInP layer 2 is larger than 0.047, and the energy band gap of the portion grown on the GaInP layer 2 is larger than that of the portion grown on the first n-type InP buffer layer 60 by 20 meV, or more.

In such production process steps of the semiconductor laser with light modulator of this third embodiment, in a state where the first n-type InP buffer layer 60 is formed on the n-type InP substrate 1, after the stripe shaped recess 1b is formed and the n-type GaInP layer 2 fills the recess 1b, the second n-type InP buffer layer 70, the undoped InGaAsP layer 4 and the p-type InP layer 5 are epitaxially grown in this order. Therefore, when the first n-type InP buffer layer 60 is for example, 0.9 $\mu$m thick, simply by growing the second n-type InP buffer layer 70, the undoped InGaAsP layer 4 and the p-type InP layer 5 on the first n-type InP buffer layer 60 with thicknesses of 0.1 $\mu$m, 0.1 $\mu$m, and 0.5 $\mu$m, respectively, the operating layer of the semiconductor laser can be produced in a thickness that realizes a stable laser oscillation, i.e., 1.5 $\mu$m or more as described above, and the operating layer of the light modulator can be produced to have a thickness of approximately 0.7 $\mu$m. Therefore, in the production process steps of the semiconductor laser with light modulator, the Ga composition of the n-type GaInP layer 2 is within a range of 0.047 to 0.064, the difference in the energy band gap between the active layer of the semiconductor laser and the light absorbing layer of the light modulator is larger than that of the semiconductor laser with light modulator of the first embodiment, thereby obtaining a semiconductor laser with light modulator in which the laser beam from the semiconductor laser is more stably absorbed at the light modulator side.

What is claimed is:

1. An integrated semiconductor laser and an electric field absorption type light modulator comprising:
    a semiconductor substrate having a first surface, a second surface, a lattice constant, and a groove extending into said semiconductor substrate from the first surface;
    a first semiconductor material having a lattice constant smaller than the lattice constant of said semiconductor substrate epitaxially grown in, filling the groove and having a surface coplanar with the first surface of said semiconductor substrate producing misfit dislocations at an interface with said semiconductor substrate;
    a second semiconductor layer epitaxially grown and disposed on the first surface of said semiconductor substrate having a lattice match with said semiconductor substrate, a part of said second semiconductor layer being an active layer of an electric field absorption type light modulator.

2. The integrated semiconductor laser and light modulator of claim 1 wherein said semiconductor substrate is InP, said first semiconductor layer is GaInP, and said second semiconductor layer comprises laminated InP, InGaAsP, and InP layers.

3. The integrated semiconductor laser and light modulator of claim 2 wherein the Ga composition ration of said GaInP layer is at least 0.047.

4. The integrated semiconductor laser and light modulator of claim 3 wherein the Ga composition ratio of said GaInP layer is within a range from 0.047 to 0.05.

5. An integrated laser and light modulator comprising:
- a semiconductor substrate having a first surface, a second surface, a lattice constant;
- a first semiconductor layer epitaxially grown on said semiconductor substrate lattice matching with said semiconductor substrate and having a groove extending into part of said first semiconductor layer;
- a second semiconductor layer having a lattice constant smaller than the lattice constant of said semiconductor substrate, epitaxially grown in and filling the groove and having a surface coplanar with the front surface of said first semiconductor layer so that misfit dislocations are produced at an interface of said second semiconductor layer and said semiconductor substrate;
- a third semiconductor layer epitaxially grown and disposed on said first semiconductor layer lattice matching with said semiconductor substrate, a portion of said third semiconductor layer being an operating layer of an electric field absorption type light modulator.

6. The integrated semiconductor laser and light modulator of claim 5 wherein said semiconductor substrate is InP, said first semiconductor layer is InP, said second semiconductor layer is GaInP, and said third semiconductor layer comprises laminated InP, InGaAsP, and InP layers.

7. The integrated semiconductor laser light modulator of claim 6 wherein the Ga composition ratio of said GaInP layer is at least 0.047.

8. The integrated semiconductor laser and light modulator of claim 7 wherein the Ga composition ratio of said GaInP layer is within a range from 0.047 to 0.064.

* * * * *